United States Patent [19]

Doumas

[11] Patent Number: 5,142,561
[45] Date of Patent: Aug. 25, 1992

[54] X-RAY LITHOGRAPHY SCANNING MIRROR

[75] Inventor: Argyrios Doumas, Smithtown, N.Y.

[73] Assignee: Grumman Aerospace Corporation, Bethpage, N.Y.

[21] Appl. No.: 706,384

[22] Filed: May 28, 1991

[51] Int. Cl.$^5$ ............................................. G21K 1/06
[52] U.S. Cl. ..................................... 378/84; 378/34; 378/145
[58] Field of Search ............ 378/73, 84, 34, 35, 378/70, 71, 145, 137

[56] References Cited

U.S. PATENT DOCUMENTS

| | | | |
|---|---|---|---|
| 4,192,994 | 3/1980 | Kastner | 378/145 |
| 4,949,367 | 8/1990 | Huizing et al. | 378/84 |
| 5,031,199 | 7/1991 | Cole, III et al. | 378/84 |

*Primary Examiner*—Janice A. Howell
*Assistant Examiner*—Don Wong
*Attorney, Agent, or Firm*—Richard G. Geib; Daniel J. Tick

[57] ABSTRACT

An X-ray lithography optical system has an elongated concave scanning mirror spaced a first predetermined distance from a source of X-rays. The mirror has a reflecting surface of part toroidal configuration having a first radius of curvature coincident with that of a torus of which the mirror is part and spaced opposite first and second ends having a second radius of curvature, different from the first radius of curvature, coincident with that of the circle which generates the torus. A photoresist is spaced a second predetermined distance from the mirror and positioned to receive X-rays reflected by the mirror. The second predetermined distance is greater than the first predetermined distance. A mask in proximity with the photoresist permits a predetermined pattern of X-rays to impinge on the photoresist and blocks all other X-rays.

10 Claims, 4 Drawing Sheets

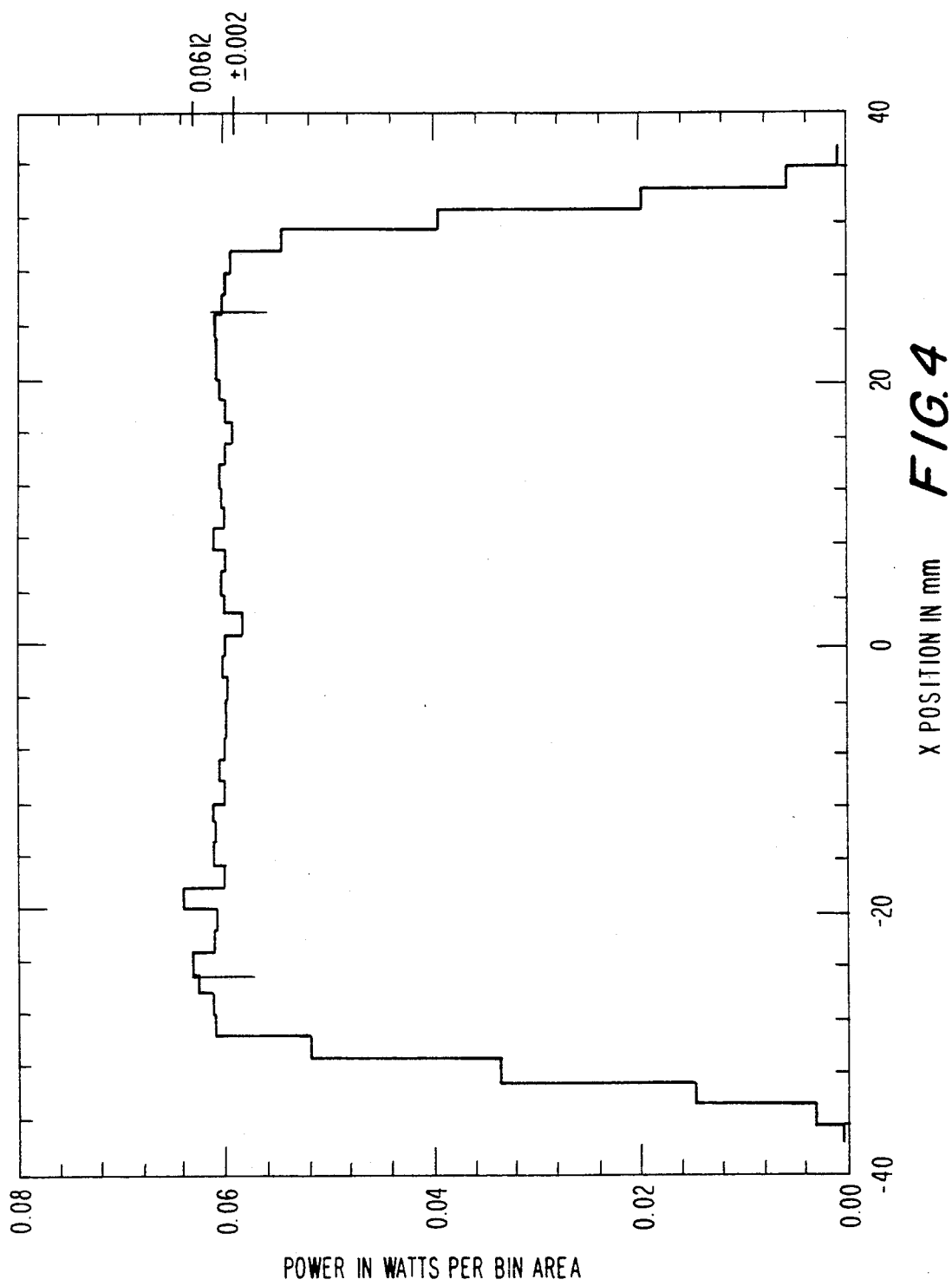

X-RAY LITHOGRAPHY SCANNING MIRROR

BACKGROUND OF THE INVENTION

The present invention relates to an X-ray lithography scanning mirror. More particularly, the invention relates to a scanning single mirror used in X-ray lithography.

X-ray lithography is a technique which uses photons in the approximately 800 to 1800 eV energy range for the fabrication of electronic and computer chips. A mask with the desired circuit pattern, or its inverse pattern, is located in front of the wafer and is irradiated by the X-rays. The exposed, or unexposed, areas are then chemically etched away, so that circuit features are imprinted on the silicon wafer. At present, the primary means of chip fabrication is through the use of photons in the visible and ultraviolet energies, up to approximately $10^2$ eV. The best line width resolution for this "optical" lithography is about 0.5 micron or micrometer, where 1 micrometer or micron equals $10^{-6}$ meter. At present, X-ray lithography has been used to achieve line widths as good as 0.3 micron in a research environment. Presumably, the next generation lithographic techniques, that is, using X-rays for mass production of chips, will yield line resolutions of 0.25 micron, or better.

The energy range for the X-rays used is typically approximately 800 to 1800 eV. The X-ray source which holds the most promise for generating photons of the required energy and intensity is a synchrotron. The synchrotron uses magnets to accelerate electrons along a specific orbit around the machine. At each point where magnets bend the beam of electrons to keep them in their orbit, photons from infrared energies, up to 10,000+ eV, are emitted. A small fraction of these photons are accepted into a beamline which is tangent to the radius of the bending angle in the machine. The beamline is an ultra high vacuum stainless steel pipe with equipment designed to filter the undesirable low and high energy photons. The beamline, therefore, serves as a means to permit mostly X-rays in the 800 to 1800 eV energy range to pass through to the "stepper", where the silicon wafers are awaiting irradiation.

Most of the sub-800 eV X-rays are eliminated as they emerge through the exit window on their way out of the beamline and into the stepper. Reflection of the X-ray beam from a mirror is the technique used to eliminate most of the X-rays which have energies higher than 1800 eV. Shaping the mirror as a curved surface permits it to be used to focus the X-ray beam to a desired beam spot shape. The advantage of focusing a large beam down to a smaller size is that the wafers in the stepper can be irradiated more quickly. The size of the field on the wafer to be irradiated is expected to be as large as 1" tall × 2" wide. It would therefore be desirable to shape the beam spot so that it is at least as wide as the width of the field. The most common approach for irradiating the wafer is to take this wide and well, especially vertically, focused beam and either scan it across the face of the field, or use a stationary X-ray beam and scan the wafer in front of such beam.

Great difficulties are encountered at present in achieving 0.25 micron resolution with scanning steppers, because of vibration and alignment problems associated with their scanning. Apparently, a scanning mirror system will be required in the near future for the industrialization of chips with 0.25 micron features. The optics may therefore require an ability to scan the X-ray beam across the wafer as well as the ability to shape the beam properly and with the appropriate beam characteristics. The University of Wisconsin's Center for X-ray Lithography (CXRL), which is one of the primary research centers in this field, has recently developed a three-mirror system for use at their synchrotron, ALADDIN, which can achieve 0.25 micron resolution. This mirror system uses two focusing mirrors along with a plane mirror for scanning their beam. No single mirror approach is known which can both focus the beam and scan it while still maintaining the 0.25 micron resolution requirements over a field width of 50 mm. The scanning mirror of the invention is able to achieve 0.25 micron resolution, or better, for a 50 mm wide field while being able to scan the X-ray beam across a stationary wafer.

Silicon wafers are irradiated by placing a mask pattern, describing the circuit pattern to be etched into the silicon, in front of the wafer with the X-ray beam impinging its surface. The mask openings permit the X-rays to pass to the silicon for irradiation and the opaque parts of the mask attenuate most of the X-rays. This mask pattern is printed onto the wafer and later etched for chip fabrication. Ideally, the X-rays should be incident perpendicular to the mask and wafer, that is, with 0 divergence, to achieve the best line resolution. Due to the finite size of the source and the fact that an attempt is made to take a large angular acceptance of the X-ray emissions from the source and focus it to the desired size, the rays impinging on the mask will diverge or converge to a certain extent. The key is to minimize the angular deviation of the X-rays from the normal. The shape of the beam spot will have implications on the throughput of the system, but does not affect the lithographic line resolution of the system. That is, how many wafers can be irradiated in a given period of time. For this reason, the mirror design has been optimized to have good divergence properties at the expense of a non-rectangular beam spot shape, and therefore lower throughput.

The beam divergence/convergence deviation from a ray normal to the mask contributes to what is called the overlay error. The smaller the overlay errors, the better the line resolution one can get. One of the two causes of overlay error is called the horizontal magnification (X'). The rays of the mirror of the invention actually converge to the center of the beam spot along the horizontal plane. The divergence is greatest at the outermost parts of the beam along the horizontal. Thus, X' is approximately ±0.41 mrad at ±25 mm. Moving toward the bottom extreme, this divergence becomes almost ±0.06. Moving toward the top extreme, the horizontal divergence increases to ±0.8 mrad. Notably, the divergence at the top extreme is not nearly as large, small as it is, anyway, as it appears, since the outer horizontal parts of the beam are considerably higher than the top edge of the field. In reality, therefore, the maximum horizontal divergence is only a little greater than the value at the nominal position, since the top of the smile is already almost touching the top of the field. The maximum horizontal divergence is then approximately ±0.50 mrad at ±25 mm at the upper outer edges of the field. It should also be noted that the divergence quoted here is for an uncorrected system and with a line fit through the distribution to determine the average divergence as a function of horizontal position. If the distribution can be accurately described by some type of function such as a line, then some compensations may be made for a larger than desired divergence by modifying the fabrication of the mask. If the field size is only 25 mm wide, the horizontal divergence at the extremes, ±12.5 mm, at the nominal mirror angle position is only ±0.20 mrad and only about ±0.25 mrad in the worst case, with the mirror tilted to cover the top extremes of the field.

Another cause of overlay error is the vertical magnification or distortion. This relates the divergence of the X-rays in the vertical (Z) direction as a function of position along the width of the beam, horizontally. The uncorrected divergence at ±25 mm is approximately 0.4 mrad and only 0.1 mrad at ±12.5 mm. The shape of the distribution changes in width slightly for the three positions, but with only a maximum of about ±10% change in the divergence values. The entire distribution does shift considerably in Z', or the divergence of X-rays in the Z direction. This shift of the distribution in phase space is scan induced and is linearly related to the mirror angle as scanning is in the Z direction. This effect is inherent in any scanning mirror system, since when the angle of the X-ray beam is changed, the angle of the rays relative to the mask normal changes. Since this divergence is directly related to the angle of the scanning mirror, it can be compensated for in the mask fabrication and should not present any loss of line resolution.

The aforedescribed overlay errors affect the line resolution. Since a mask is used to cast a shadow of the pattern to be irradiated on the wafer, the gap distance between the mask and wafer becomes critical in defining how large a divergence is tolerable for achieving the desired resolution. Since the stepper will also have some errors associated with proper mask/wafer alignments and vibrations, there is that much less error budget available to the optics for achieving the desired resolution. Typical gap sized may range from as small as 10 microns to several tens of microns. The overlay error is computed as follows:

Overlay Error (in nm) = [(Horiz. Magn.)² + (Vert. Distort.)²]^½ (in rad.) × gap distance (in nm)

The principal object of the invention is to provide an X-ray lithography optical system which functions efficiently, effectively and reliably in fabricating a chip.

An object of the invention is to provide an X-ray lithography scanning mirror which functions efficiently, effectively and reliably in assisting an X-ray lithography optical system in fabricating a chip.

Another object of the invention is to provide an X-ray lithography scanning mirror of relatively simple structure which effectively reduces the overlay error in the fabrication of a chip.

Still another object of the invention is to provide an X-ray lithography scanning mirror which provides a substantially uniform distribution.

Yet another object of the invention is to provide an X-ray lithography scanning mirror which provides a distribution uniform to within ±5%.

Another object of the invention is to provide an X-ray lithography scanning mirror of relatively simple structure which functions efficiently, effectively and reliably to effectively reduce the overlay error and provide a substantially uniform distribution in the fabrication of a chip.

BRIEF SUMMARY OF THE INVENTION

In accordance with the invention, an X-ray lithography scanning mirror comprises an elongated concave reflecting surface of part torodial configuration having a first radius of curvature coincident with that of a torus of which the mirror is part and spaced opposite first and second ends having a second radius of curvature, different from the first radius of curvature, coincident with that of the circle which generates the torus.

In a first modification, the first radius is in the range of approximately 100 to 150 meters and the second radius is in the range of approximately 185 to 220 millimeters.

In a second modification, the first radius is in the range of approximately 100 to 150 meters and the second radius is in the range of approximately 170 to 220 millimeters.

In a third modification, the first radius is in the range of approximately 100 to 150 meters and the second radius is in the range of approximately 160 to 210 millimeters.

In a fourth modification, the first radius is in the range of approximately 110 to 160 meters and the second radius is in the range of approximately 190 to 230 millimeters.

In the first modification, the first radius is approximately 125 meters and the second radius is approximately 200 millimeters.

In accordance with the invention, an X-ray lithography optical system comprises a source of X-rays, an elongated concave scanning mirror spaced a first predetermined distance from the source, the scanning mirror having a reflecting surface of part toroidal configuration having a first radius of curvature coincident with that of a torus of which the mirror is part and spaced opposite first and second ends having a second radius of curvature, different from the first radius of curvature, coincident with that of the circle which generates the torus, a photoresist spaced a second predetermined distance from the mirror and positioned to receive X-rays reflected by the mirror, the second predetermined distance being greater than the first predetermined distance, and a mask in proximity with the photoresist for permitting a predetermined pattern of X-rays to impinge on the photoresist and substantially blocking all other X-rays. This is with the mirror at a grazing angle of 1.5° to 2.5° with this example at 2°.

In the first modification, the first predetermined distance is substantially 3 meters, the first radius is in the range of approximately 100 to 150 meters and the second radius is in the range of approximately 185 to 220 millimeters.

In the second modification, the first predetermined distance is substantially 2.75 meters, the first radius is in the range of approximately 100 to 150 meters and the second radius is in the range of approximately 170 to 220 millimeters.

In the third modification, the first predetermined distance is substantially 2.50 meters, the first radius is in the range of approximately 100 to 150 meters and the second radius is in the range of approximately 160 to 210 millimeters.

In the fourth modification, the first predetermined distance is substantially 3.25 meters, the first radius is in the range of approximately 110 to 160 meters and the second radius is in the range of approximately 190 to 230 millimeters.

In the first modification, the first predetermined distance is substantially 3 meters, the first radius is approximately 125 meters and the second radius is approximately 200 millimeters.

BRIEF DESCRIPTION OF THE DRAWINGS

In order that the invention may be readily carried into effect, it will now be described with reference to the accompanying drawings, wherein:

FIG. 4 is graphical presentation of the beam spot power uniformity as a function of the horizontal position along the beam spot.

DETAILED DESCRIPTION OF PREFERRED EMBODIMENTS

For the mirror of the invention, the uncorrected, or uncompensated, overlay error at the nominal position is $g[(0.41)^2+(0.4)^2]^{\frac{1}{2}}$ which provides 5.8 nm per 10 micrometers of gap distance total error at the extremes, that is, ±25 mm width, and where 1 nm equals $10^{-9}$ meter. Even at the top scan position, where the horizontal magnification is slightly worse, the overlay error is only 6.5 nm per 10 micron gap. If the field need only be 25 mm wide, this mirror has an overlay error of only 2.7 nm per 10 micron gap in the worse situation; that is, at the top of the field. An X-ray lithography stepper manufactured by SVGL will probably be used by IBM at their facilities. To achieve 0.25 micron lithography, this stepper has a 16 nm overlay error budget allocation for the optics. In the mirror of the invention, this translates to more freedom for the stepper to be able to use a gap size larger than approximately 10 microns, or the ability to do better than 0.25 micron lithography with a 10 micron gap.

A shape which is wide enough to cover the desired field width such as, for example, 50 mm, and as tightly focused in height as possible, such as a few mm, is preferable. The mirror of the invention produces a "smiley", rather than a rectangular, shape. This does not affect the ability to achieve 0.25 micron, or better line resolution, but has an impact on the time it takes to scan across the height of the field to be irradiated on the wafer. Since the field should be overscanned to ensure proper irradiation, the taller the beam height, the more overscanning must be performed. The rectangular box is the size typical of a large field of 50 mm×25 mm on a wafer.

The beam becomes wider at the bottom scan position and narrower at the top scan position. This is indicative of a change in the incident grazing angle of a figured mirror. Changing the grazing angle for a figured mirror is equivalent to changing the curvature of the mirror and this, in turn, will change the focusing effects on the X-ray beam. The height of the smile is approximately 9.0 mm tall at ±25 mm. If a 25 mm wide field size is used, the height of the beam shape is only about 3.6 mm tall at this width, and this would yield a considerable improvement in the throughput of the system.

The mirror of the invention causes the X-rays to converge slightly in the horizontal axis. Thus, in moving further away from the mirror, the shape of the beam spot becomes narrower, until at a long distance away, that is, tens of meters, the rays will focus and then diverge. The X-ray beam does have a slight focusing effect in the vertical, that is, the Z axis, a few meters after the mirror beyond which the beam spot is enhanced in the Z direction.

Figure 1:
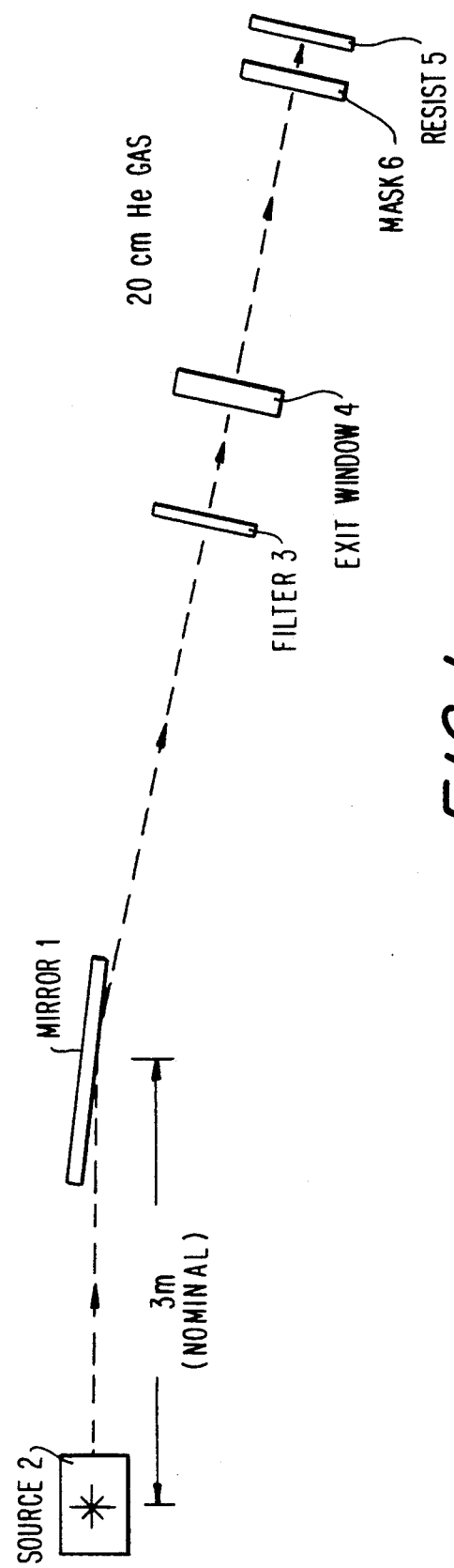
FIG. 1 is a schematic diagram of an embodiment of the X-ray lithography optical system of the invention.

FIG. 1 is a schematic diagram of a basic layout of a typical X-ray lithography beamline optical system with the placement of the various critical parts. To attain the optics design of the invention, the mirror 1 is placed 3 m from the synchrotron or source 2 and the beam spot shape is at 8.5 m after said mirror. This provides a total beamline length of 11.5 m. There is a great deal of flexibility in the design of the invention for the mirror placement and the total length of the beamline. The position of the mirror 1 relative to the source 2 will require a slight modification to the mirror shape for optimized performance, although the system would still work well for up to a ±500 mm positional shift. The beamline passes through a one micron silicon filter 3 and an 18 micron beryllium exit window 4 to a resist 5 via 20 cm of Helium gas and a 2 micron silicon carrier 6.

Figure 2:
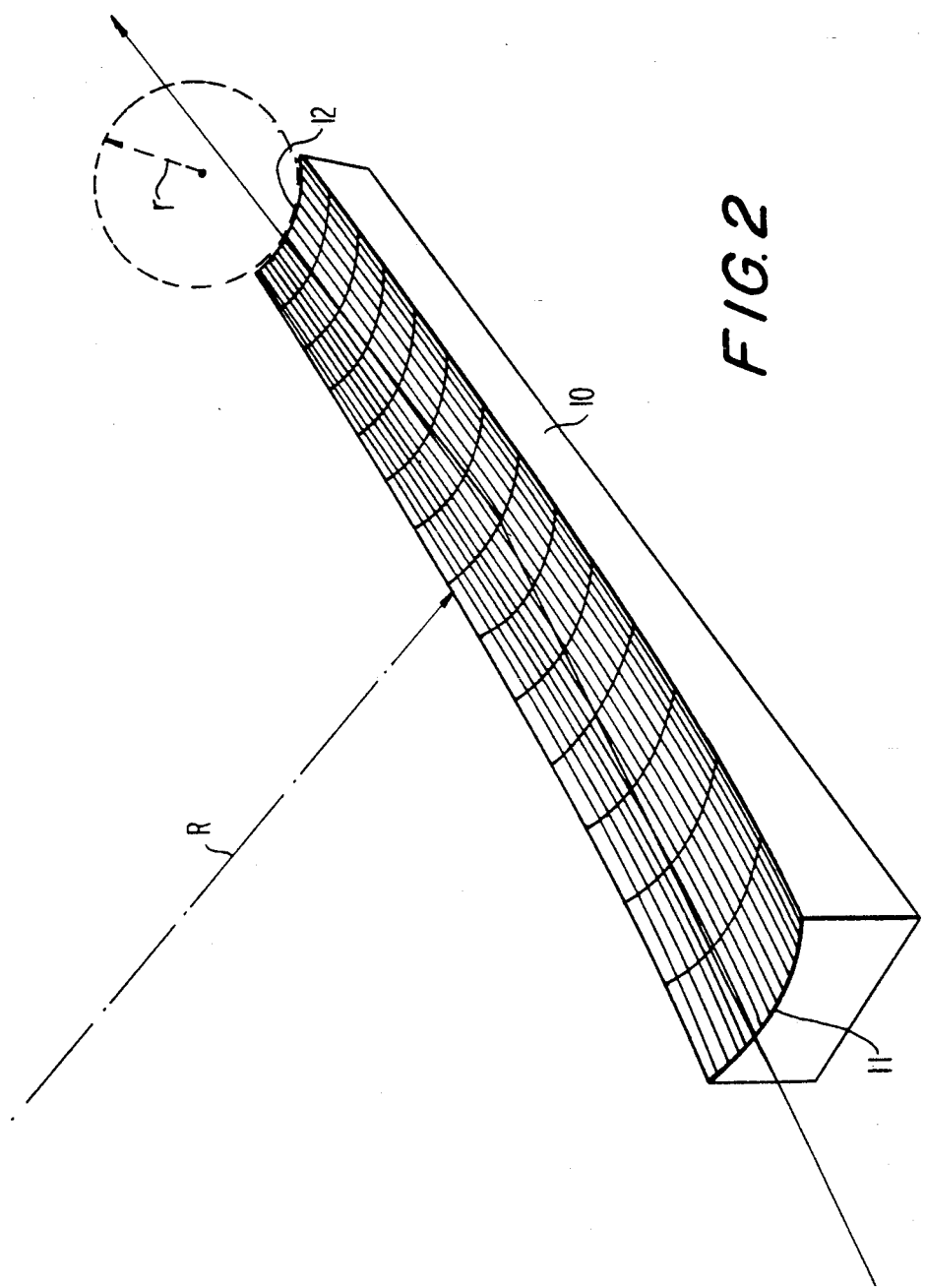
FIG. 2 is a schematic diagram of an embodiment of the X-ray lithography scanning mirror of the invention.

An embodiment of the scanning mirror of the invention is shown in FIG. 2. As shown in FIG. 2, the mirror 10 is concave, of part toroidal configuration having a first radius of curvature R coincident with that of a torus of which the mirror is part and spaced opposite first and second ends 11 and 12, respectively, having a second radius of curvature r, different from the first radius of curvature, coincident with that of the circle which generates the torus. The surface of the mirror 10 is concave lengthwise and widthwise. There is a range of radii and mirror positions relative to the source which provides results very close to the optimized mirror shape. In general, for a distance of 3 m from the source, the small radius of curvature r can be in the range of approximately 185 to 220 mm and the large radius of curvature R can be in the range of approximately 100 to 150 m. At a distance of 2.75 m, r can range from approximately 170 to 220 mm and R can range from approximately 100 to 150 m. At 2.5 m, r can range from approximately 160 to 210 mm and R can range from approximately 100 to 150 m. At a distance of 3.25 m, r can be approximately 190 to 230 mm and R can be approximately 110 to 160 m.

The optimized values are a distance of 3 m from the source and with r=202 mm and R=122 m. The nominal angle of the mirror is 88°, which means a 2° grazing incidence angle. As hereinbefore indicated, the beam spot will change slightly with increasing distance from the mirror, but this will not affect the resolution achievable; only the throughput. Because the rays reflected by the mirror emerge with only a small divergence angle, the mirror system of the invention provides a beam spot shape which changes very little 4 to 12 m after the mirror; that is, a beamline length of 7 to 15 m, with typical X-ray lithography beamline lengths being 9 to 13 m. The data specifically described herein is for a source-to-image distance of 11.5 m.

Another parameter which affects the feature size attainable is the blur. The optics induced blur can be evaluated by looking at the spread, that is, the width, of the point distribution in the X' vs. X and Z' vs. X divergence plots. This optics blur component is approximately 1.8±5% mrad for the mirror of the invention. The non-uniformity in the linewidth is then approximately 1.8 nm per 10 microns of gap. The aforementioned SVGL stepper has a 9 nm allocation to the optics for 0.25 micron lithography. Reiterating, the mirror can achieve the required feature size even with a gap size much larger than 10 microns, or much better line features than 0.25 micron at a 10 micron gap size.

Another parameter which is of concern in the optics is the power uniformity in the beam at the wafer. IBM has stated the need for beam power uniformities of ±5%. The absolute value of the power is not the key here; what is important is that the distribution be uniform to within ±5%. This mirror system has a uniformity along the width of the beam of better than ±4%. When the mirror is scanned, however, the shape of the beam changes, since the mirror has a determined configuration, and this results in a change in the power delivered per unit time in any given part of the beam spot. The overall power transmitted changes as a function of the mirror angle. These two effects can result in additional non-uniformities in the delivered power over the exposure area. This mirror provides better than 8% over the entire exposure field. This effect can be compensated for by varying the rate at which the mirror is scanned as a function of the mirror angle and this should permit approaching 4%. As long as the beam meets the uniformity requirements along the horizontal axis, the uniformity requirements in general can be achieved.

Figure 3:
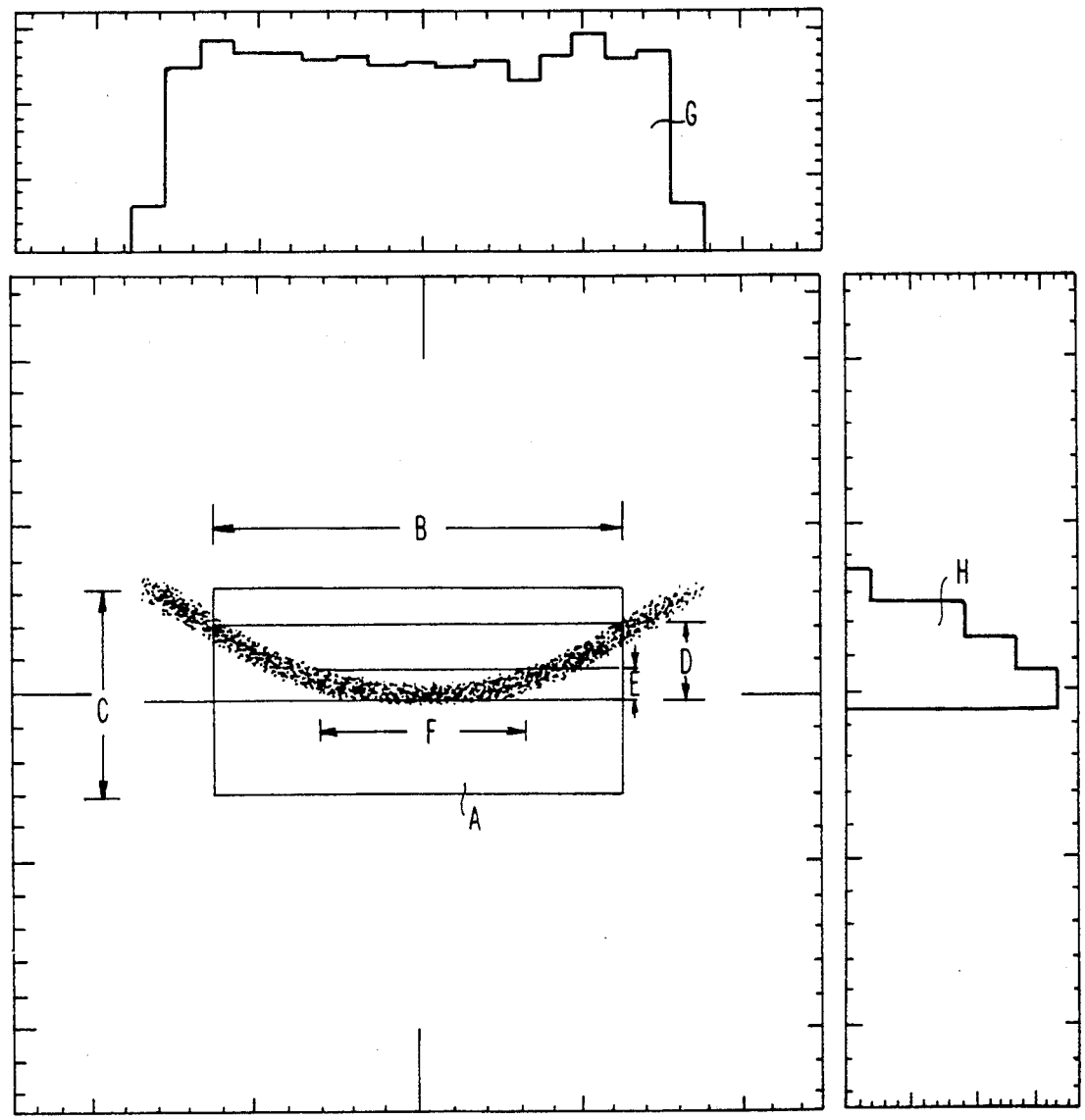
FIG. 3 is a plot of the beam shape, Z vs X, at a distance of 11.5 m from the source.

In FIG. 3, which is a plot of the beam shape, Z vs X, at a distance of 11.5 m from the source, the rectangular box depicts a field having a width B of 50 mm and a height C of 25 mm which needs to be irradiated. The height D of the "smiley" beam shape is 9 mm for a field having a width B of 50 mm and the height E is 3.6 mm for a field having a width F of 25 mm. A total of four thousand rays were traced for this analysis. A histogram G above the plot shows the distribution of rays as a function of the horizontal position along the beam spot. This also provides a crude check of the uniformity of the beam. A histogram H to the right of the plot shows the distribution of the rays as a function of the vertical beam spot dimensions.

In FIG. 4, which is a graphical presentation of the beam spot power uniformity as a function of the horizontal position along the beam spot, the absolute power is not of concern, although the relative power from horizontal bin to horizontal bin is. The power over the central 50 mm segment of the beam spot is uniform to within ±4%. In FIG. 4, the abscissa represents the X position in mm and the ordinate represents the power in Watts per bin area. This analysis is for the nominal mirror angle and uses approximately 275,000 rays for statistical accuracy.

Although shown and described in what are believed to be the most practical and preferred embodiments, it is apparent that departures from the specific design described and shown will suggest themselves to those skilled in the art and may be made without departing from the spirit and scope of the invention. I, therefore, do not wish to restrict myself to the particular construction described and illustrated, but desire to avail myself of all modifications that may fall within the scope of the appended claims.

I claim:

1. An X-ray lithography scanning mirror, comprising an elongated concave reflecting surface of part toroidal configuration having a first radius of curvature coincident with that of a torus of which the mirror is part and in the range of approximately 100 to 150 meters and spaced opposite first and second ends having a second radius of curvature, different from the first radius of curvature, coincident with that of the circle which generates the torus and in the range of approximately 185 to 220 millimeters.

2. An X-ray lithography scanning mirror as claimed in claim 1, wherein said first radius is approximately 125 meters and said second radius is approximately 200 millimeters.

3. An X-ray lithography scanning mirror, as claimed in claim 1, further comprising a source of X-rays spaced a first predetermined distance of substantially 3 meters from said mirror, a photoresist spaced a second predetermined distance from said mirror and positioned to receive X-rays reflected by said mirror, said second predetermined distance being greater than first predetermined distance, and a mask in proximity with said photoresist for permitting a predetermined pattern of X-rays to impinge on said photoresist and substantially blocking all other X-rays.

4. An X-ray lithography optical system as claimed in claim 3, said first radius is approximately 125 meters and said second radius is approximately 200 millimeters.

5. An X-ray lithography scanning mirror, comprising an elongated concave reflecting surface of part toroidal configuration having a first radius of curvature coincident with that of a torus of which the mirror is part and in the range of approximately 100 to 150 meters and spaced opposite first and second ends having a second radius of curvature, different from the first radius of curvature, coincident with that of a circle which generates the torus and in the range of approximately 170 to 220 millimeters.

6. An X-ray lithography scanning mirror, as claimed in claim 5, further comprising a source of X-rays spaced a first predetermined distance of substantially 2.75 meters from said mirror, a photoresist spaced a second predetermined distance from said mirror and positioned to receive X-rays reflected by said mirror, said second predetermined distance being greater than said first predetermined distance, and a mask in proximity with said photoresist for permitting a predetermined pattern of X-rays to impinge on said photoresist and substantially blocking all other X-rays.

7. An X-ray lithography scanning mirror, comprising an elongated concave reflecting surface of part toroidal configuration having a first radius of curvature coincident with that of a torus of which the mirror is part and in the range of approximately 100 to 150 meters and spaced opposite first and second ends having a second radius of curvature, different from the first radius of curvature, coincident with that of the circle which generates the torus and in the range of approximately 160 to 210 millimeters.

8. An X-ray lithography scanning mirror, as claimed in claim 7, further comprising a source of X-rays spaced a first predetermined distance of substantially 2.50 meters from said mirror, a photoresist spaced a second predetermined distance from said mirror and positioned to receive X-rays reflected by said mirror, said second predetermined distance being greater than said first predetermined distance, and a mask in proximity with said photoresist for permitting a predetermined pattern of X-rays to impinge on said photoresist and substantially blocking all other X-rays.

9. An X-ray lithography scanning mirror, comprising an elongated concave reflecting surface of part toroidal configuration having a first radius of curvature coincident with that of a torus of which the mirror is part and in the range of approximately 110 to 160 meters and spaced opposite first and second ends having a second radius of curvature, different from the first radius of curvature, coincident with that of the circle which generates the torus and in the range of approximately 190 to 230 millimeters.

10. An X-ray lithography scanning mirror, as claimed in claim 9, further comprising a source of X-rays spaced a first predetermined distance of substantially 3.25 meters from said mirror, a photoresist spaced a second predetermined distance from said mirror and positioned to receive X-rays reflected by said mirror, said second predetermined distance being greater than said first predetermined distance, and a mask in proximity with said photoresist for permitting a predetermined pattern of X-rays to impinge on said photoresist and substantially blocking all other X-rays.

* * * * *